United States Patent [19]
Neu

[11] Patent Number: 5,105,103
[45] Date of Patent: Apr. 14, 1992

[54] INTEGRATED BINARY AMPLIFIER HAVING A DARLINGTON CONFIGURATION

[75] Inventor: Georges Neu, Mareil-Sur-Mauldre, France

[73] Assignee: Bull, S.A., France

[21] Appl. No.: 430,668

[22] Filed: Nov. 2, 1989

[30] Foreign Application Priority Data

Nov. 8, 1988 [FR] France .................. 88 14540

[51] Int. Cl.⁵ .............................. H03K 3/26
[52] U.S. Cl. ................... 307/446; 307/473; 307/570; 307/315
[58] Field of Search ............ 307/446, 473, 570, 315

[56] References Cited
U.S. PATENT DOCUMENTS

| | | | |
|---|---|---|---|
| 4,303,841 | 12/1981 | Baker | 307/315 |
| 4,701,635 | 10/1987 | Kawazoe et al. | 307/315 |
| 4,810,903 | 3/1989 | Bushey et al. | 307/446 |
| 4,883,979 | 11/1989 | Tran | 307/446 |

Primary Examiner—Stanley D. Miller
Assistant Examiner—Scott A. Ouellette
Attorney, Agent, or Firm—Wolf, Greenfield & Sacks

[57] ABSTRACT

An integrated binary amplifier connected to a bus such as a precharged bus and having a field effect transistor receiving an input signal and coupled to series-connected bipolar transistors including an output transistor. The base of the output transistor is connected to a fixed potential by a field effect transistor of which the type and the control means assure its conduction when the bipolar transistors are conductive. The output signal thus has its low level to ground.

33 Claims, 4 Drawing Sheets

INTEGRATED BINARY AMPLIFIER HAVING A DARLINGTON CONFIGURATION

BACKGROUND OF THE INVENTION

The present invention relates in general to binary amplifiers and to integrated circuits incorporating such binary amplifiers. More particularly, the present invention concerns binary amplifiers integrated in a semi-conductor material and essentially composed of at least one field effect transistor connected to bipolar transistors. Even more particularly, the present invention relates to integrated circuits including field effect transistors of the complementary type and bipolar transistors, such as BiCMOS integrated circuits in which the field transistors are of the CMOS (complementary metal oxide semi-conductor) type. The invention applies notably to binary amplifiers in information processing systems, such as interface amplifiers (buffer amplifiers) connected to output terminals of an integrated circuit to transmit a binary signal to a load circuit. For example, the load circuit may be a bus or an interface with an integrated memory. In applications where several binary amplifiers are connected to a bus, a third logic state, referred to as a high impedance state and controlled by a validation signal, is added to each amplifier. In this state, the binary amplifier assures electrical isolation with the bus in a way so as not to interfere with the signals sent on the bus originating from another amplifier. The invention also concerns these amplifiers.

Integrated binary amplifiers, composed of a field effect transistor as an input element and a bipolar transistor as an output element, have the disadvantage of having a performance that is degraded when the capacitance of the load circuit exceeds a relatively low value of, for example, 10 pF. One solution consists of connecting to the field effect transistor two bipolar transistors in series (Darlington pair). To optimize the time of signal propagation in the amplifier, the electrical charges which accumulate at the bases of the bipolar transistors are eliminated. This elimination is done during the period of blockage of the bipolar transistors, by means of the discharge elements connecting the respective bases of the transistors to a supply potential, usually ground. Each discharge element is a resistance serving for polarization of the bipolar transistors during their functioning, or a field effect transistor in an amplifier not utilizing the resistance. Such an amplifier has the advantage of tolerating large capacitances from its load circuit, up to 200 pF for example, and not necessitating the use of other than standard size transistors.

Most generally, the same advantages are obtained applying the same solution to classic binary amplifiers composed of at least two field effect transistors connected respectively to a bipolar transistor. The most simple of these amplifiers includes two field effect transistors of complementary type receiving the same input signal. The field effect transistor for high level amplification is connected to two bipolar transistors in series. The field effect transistor for low level amplification is connected to a single bipolar transistor. In the amplifier, the base of each bipolar transistor is provided with an element for discharge of capacitance, which may be a resistor or a field effect transistor. Such an amplifier is described in U.S. Pat. No. 4,638,186. However, putting bipolar transistors in series has the disadvantage of reducing the excursion of the output signal. This disadvantage clearly appears when using, for example, an amplifier composed of a pair of CMOS transistors each connected to two bipolar transistors in series. It is known that the voltage of the emitter-base junction (Vbe) of a bipolar transistor may attain 0.8 volts. As a consequence, if for example, the supply potentials are ground and +5 volts, the output signal oscillates between approximately 1.6 volts and 3.4 volts. In other words, the amplitude of the output signal is only around 2.6 volts, which would be approximately the average of the supply voltage (5 volts). The first consequence of a reduced amplitude is that the output signal is very sensitive to noise. A parasitic signal can alter the function of the component controlled by the amplifier. As a second consequence, the output signal may no longer be compatible with a load circuit including an integrated circuit—an integrated memory for example—made with TTL (transistor-transistor logic) technology. This technology requires potentials that may not be attained by a too much weakened binary amplifier output signal. The third consequence resides in the necessity of having an elevated supply voltage. This requirement is contrary to the current tendency to utilize weaker supply voltages, 3 volts for example. It is also clear, as a fourth consequence, that it is impossible to connect three binary transistors in series to accommodate an amplifier with a load circuit that is very strongly capacitive, over 200 pF for example. Another very important consequence is the fact that the low level of the output signal differs from the reference potential, usually ground, of the voltage of junction Vbe of each bipolar transistor utilized for low level amplification. The Vbe voltage gemerates, in numerous applications, a parasitic current in the load circuit of the amplifier. For example, if the load circuit is an integrated memory, composed of several cells, a leakage current across the transistors of each cell occurs, such that the total of these leakage currents in the cells produce relatively elevated differences in potential which can disturb the desired operation of the memory. To limit the low level of the output signal to a single Vbe voltage to ground, the low level amplification is ordinarily made by only one bipolar transistor whereas the high level amplification is made by a Darlington circuit, as illustrated in U.S. Pat. No. 4,638,186 mentioned above. This then essentially limits the desired performance of the amplifier.

In U.S. Pat. No. 4,476,403, the output circuit of the amplifier also contains a bipolar transistor for low level amplification and two transistors in series constituting a Darlington pair for high level amplification. The low level bipolar transistor is of the Schottky type in order to present a Vbe voltage of about 0.3 volts. In the Darlington pair serving for high-level amplification, the Vbe voltage of the first transistor is substantially shunted by a connection applying the base of the output bipolar transistor to a fixed potential. However, the structure and operation of the shunt connection which is described and illustrated in this patent is complex, difficult to execute and only applicable to TTL technology.

SUMMARY OF THE INVENTION

The present invention provides a simple and efficient solution to conserve the advantages of transistors in series in a BiMOS or BiCMOS amplifier and obtain an output signal with large excursion, substantially equal to the supply voltage. The invention also assures an immunity to noise and a compatibility with TTL technology and permits the application of a weak supply voltage and the extension of the number of bipolar transistors in series for amplification of high and low levels.

An integrated binary amplifier in accordance with the present invention, including at least one field effect transistor reacting to an input signal and connected to bipolar transistors in series, is characterized by the fact that the connection is made with a field effect transistor, of which the gate receives the input signal or its complement and of which the type assures its conduction when the bipolar transistors are conductive.

It follows that an integrated circuit according to the invention is characterized in that it includes at least one amplifier such as that defined above.

BRIEF DESCRIPTION OF THE DRAWINGS

The characteristics and advantages of the invention appear clearly from the following description, given by way of example and done with reference to the attached drawings.

In the drawings.

DESCRIPTION OF PREFERRED EMBODIMENTS

Amplifiers 10 illustrated in the drawings are made in BiCMOS technology. Amplifiers 10 are supplied with electrical energy by two potentials Ua (ground) and Ub (+5 volts), for example. They receive the input signal e and deliver output signal s. The n-MOS transistors are designated by N, the p-MOS transistors by P, and the bipolar transistors by Q.

Figure 1:
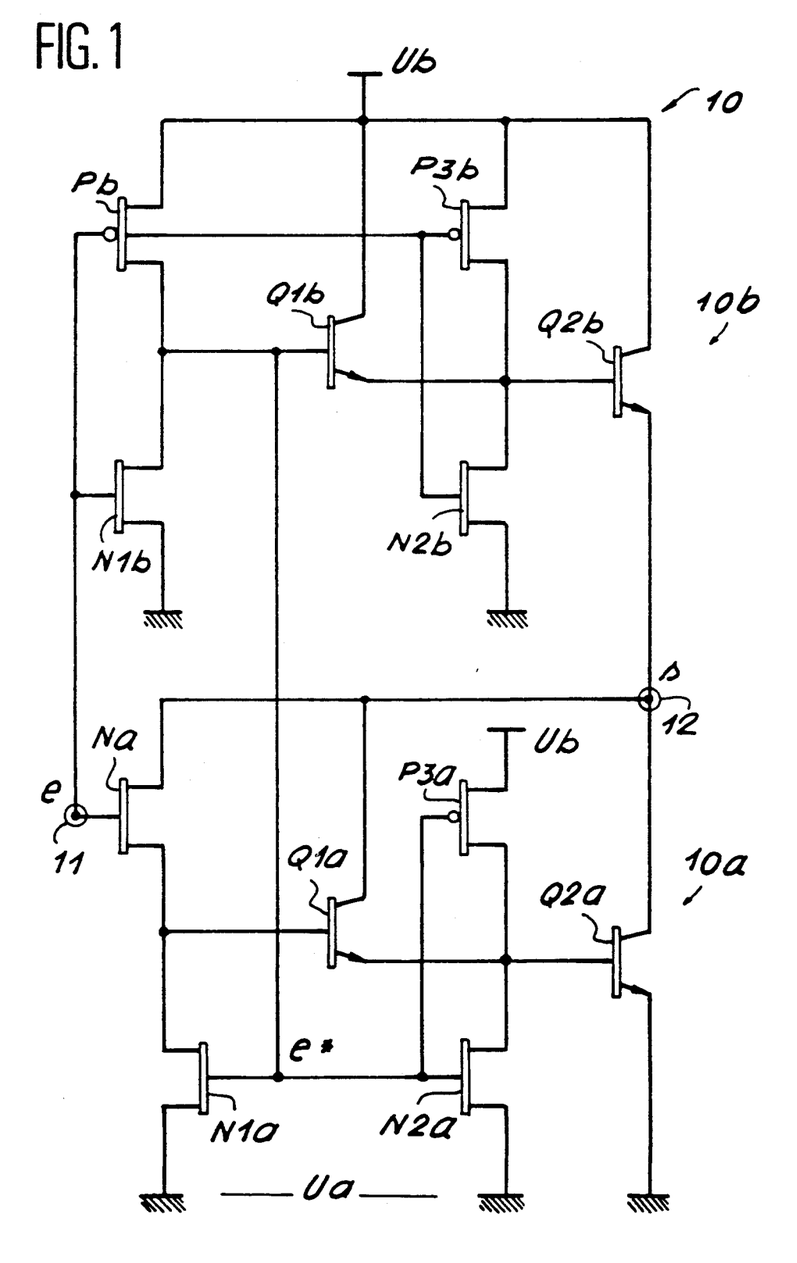
FIG. 1 is a schematic of the electrical circuit of a first type of integrated binary amplifier according to the invention, with two logic states.
Figure 2:
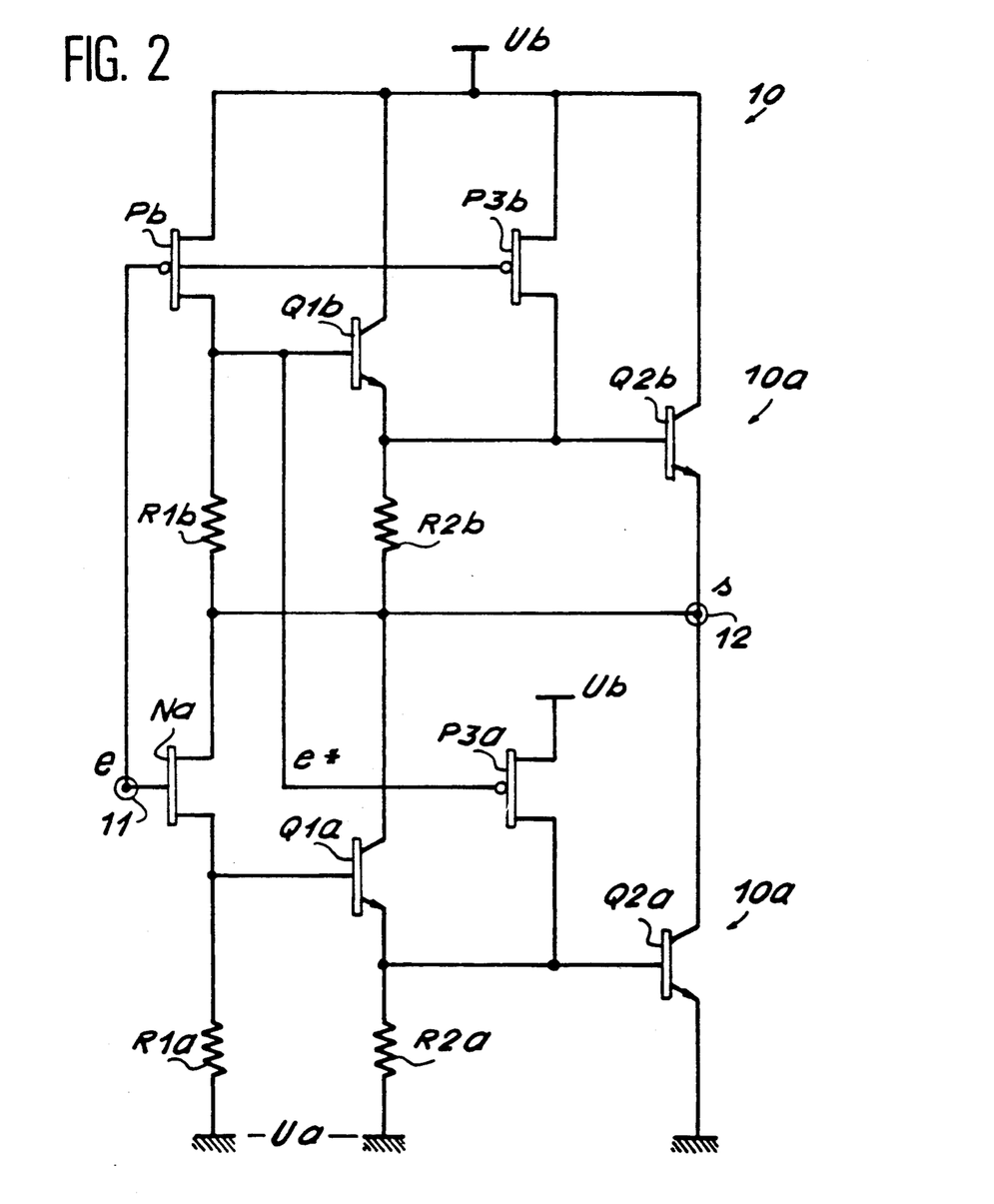
FIG. 2 is a schematic of an electric circuit of an alternate embodiment of the invention of the amplifier represented in FIG. 1.

FIGS. 1 and 2 represent, respectively, two families of the same type of amplifier 10 as constructed in accordance with the present invention. In these figures, the amplifiers 10 receive their input signal e at an input terminal 11 and deliver an output signal s at an output terminal 12. The amplifiers 10 of FIGS. 1 and 2 have two stable states and constitute the inventors based on a pair of CMOS transistors, Na and Pb. Two sections 10a, 10b are defined in these amplifiers 10, which are connected, respectively, to CMOS transistors, Na and Pb.

In the amplifier 10 of FIG. 1, transistors Na and Pb are respectively in series with the first transistors N1a and N1b having their source at ground In other words, the transistors Na and N1a have their drain source connection in series, as do transistors Pb and N1b. The drain of transistor Na is connected to the output terminal 12 and the drain of transistor Pb is connected to the supply potential Ub. The gates of transistors Na, Pb and N1b are connected to the input terminal 11 to receive the input signal e. The gate of transistor N1a is connected to the source of transistor Pb representative of the complementary input signal e*. The potential Ub is applied to collectors of a group of two bipolar transistors Q1b and Q2b coupled in series. Transistor Q1b has its base connected to the source of transistor Pb and its emitter connected to the base of transistor Q2b. The output terminal 12 is connected to the emitter of transistor Q2b as well as to other collectors of another group of two bipolar transistors Q1a and Q2a connected in series. Transistor Q1a has its base connected to the source of transistor Na and its emitter connected to the base of transistor Q2a which has its emitter grounded. In other words, transistors Q1a, Q2a form a Darlington pair as do transistors Q1b and Q2b. The bases of transistors Q2a and Q2b are, respectively, connected to the drains of two second transistors N2a, N2b, which have their sources grounded. The gate of transistor N2b receives the input signal e and the gate of transistor N2a receives the complementary input signal e*.

In operation, when the input signal e has the logic level "0", the transistor Na is off and the transistor Pb conducts. Transistors Q1a and Q2a are off while transistors Q1b and Q2b conduct. Transistors N1a and N2a conduct and discharge the bases of transistors Q1a and Q2a, such that transistors N1b and N2b are off. Output signal s on terminal 12 then has logic level "1". When input signal e takes the logic level "1", transistors Pb, Q1b, Q2b are no longer conductive. In contrast, transistor N1b and N2b thus conduct and move towards ground the charges that have accumulated on the bases of bipolar transistors Q1b and Q2b, respectively, during their operation. In section 10a, transistors Na, Q1a, Q2a become conductive and transistors N1a and N2a become non conductive. The output signal s then takes logic level "0".

A first advantage of amplifier 10 such as illustrated is to permit correct functioning in spite of a very elevated capacitance (up to 200 pF, for example) of the load circuit connected to the output terminal 12. The second advantage rests in the size of the transistors of amplifier 10, which do not need to be augmented to offer the first advantage. However, the low and high levels of the output signal, corresponding to logic states "0" and "1", deviate, respectively, from potentials Ua and Ub by the value 2 Vbe, where Vbe designates the voltage of the junction base emitter of a bipolar transistor which may attain 0.8 volts.

The invention teaches connecting, in each section 10a, 10b, the base of each output bipolar transistor Q2a, Q2b to supply potential Ub via a drain source path of a third field effect transistor of which the type and the command assure its conduction when the bipolar transistors of the group connected to the output transistor are conductive. In the example illustrated, two third transistors P3a, P3b are added having their gates respectively receiving the complementary input signal e* and the input signal e. As a result, the conduction of transistor P3a when transistors Q1a and Q2a are conducting (e="1"), contributes to injecting a satisfactory base current in transistor Q2a to maintain the low level of the output signal s very close to 0 volts by forcing output transistor Q2a into saturation. On the other hand, when transistors Q1b and Q2b are conducting (e="0"), the conduction of transistor P3b can rapidly bring the potential of the base of transistor Q2b back up to the potential Ub, in such a way that terminal 12 is at potential Ub - Vbe (of transistor Q2b). In conclusion, the output signal s of amplifier 10 in accordance with the invention has a low level substantially equal to Ua (0 volts) and a high level which differs from potential Ub by a single Vbe, which would be at a maximum of 0.8 volts. The output signal s thus provides a good immunity to noise and can adapt itself to TTL technology. In addition, amplifier 10 conserves these advantages if one or several transistors in series are added in each section 10a, 10b. Amplifier 10 then can adapt itself to very high load capacitances, greater than 200 pF for example, connecting each transistor Na, Pb to at least three bipolar transistors in series. The addition of transistors P3a and P3b respectively to bipolar output transistors Q2a, Q2b again will furnish an output signal s similar to that furnished by amplifier 10 represented in FIG. 1.

Amplifier 10 of FIG. 2 is an alternate embodiment of amplifier 10 represented in FIG. 1. The same elements have the same reference numbers. According to this embodiment, transistors N1a, N2a, N1b, N2b of FIG. 1 are replaced by resistors R1a, R2a, R1b, R2b. Resistors R1a and R1b are respectively in series with transistors Na and Pb. Resistors R1a and R2a connect respectively the bases of transistors Q1a, Q2a to potential Ua. Resistors R1b, R2b connect respectively the bases of transistors Q1b, Q2b to the drain of transistor Na and the terminal 12. The resistors serve simultaneously as biasing elements of the bipolar transistors when they are conducting and discharge elements of the capacitance of their bases when they are off. The invention applies in the same way as that described in FIG. 1. The base of each bipolar output transistor Q2a, Q2b is connected to potential Ub via a field effect transistor P3a, P3b. Transistor P3a has its gate connected to the source of transistor Pb to receive the complementary input signal e*. Transistor P3b has its gate connected to the input terminal 11 to receive the input signal e. The conduction of transistor P3a maintains the low level of the output signal s a value very close to ground by forcing output transistor Q2a into saturation. The conduction of transistor P3b carries the high level of the output signal s to Ub - Vbe. In the same way, a third bipolar transistor in series could be included in each section 10a, 10b and the same advantages would be obtained.

Figure 3:
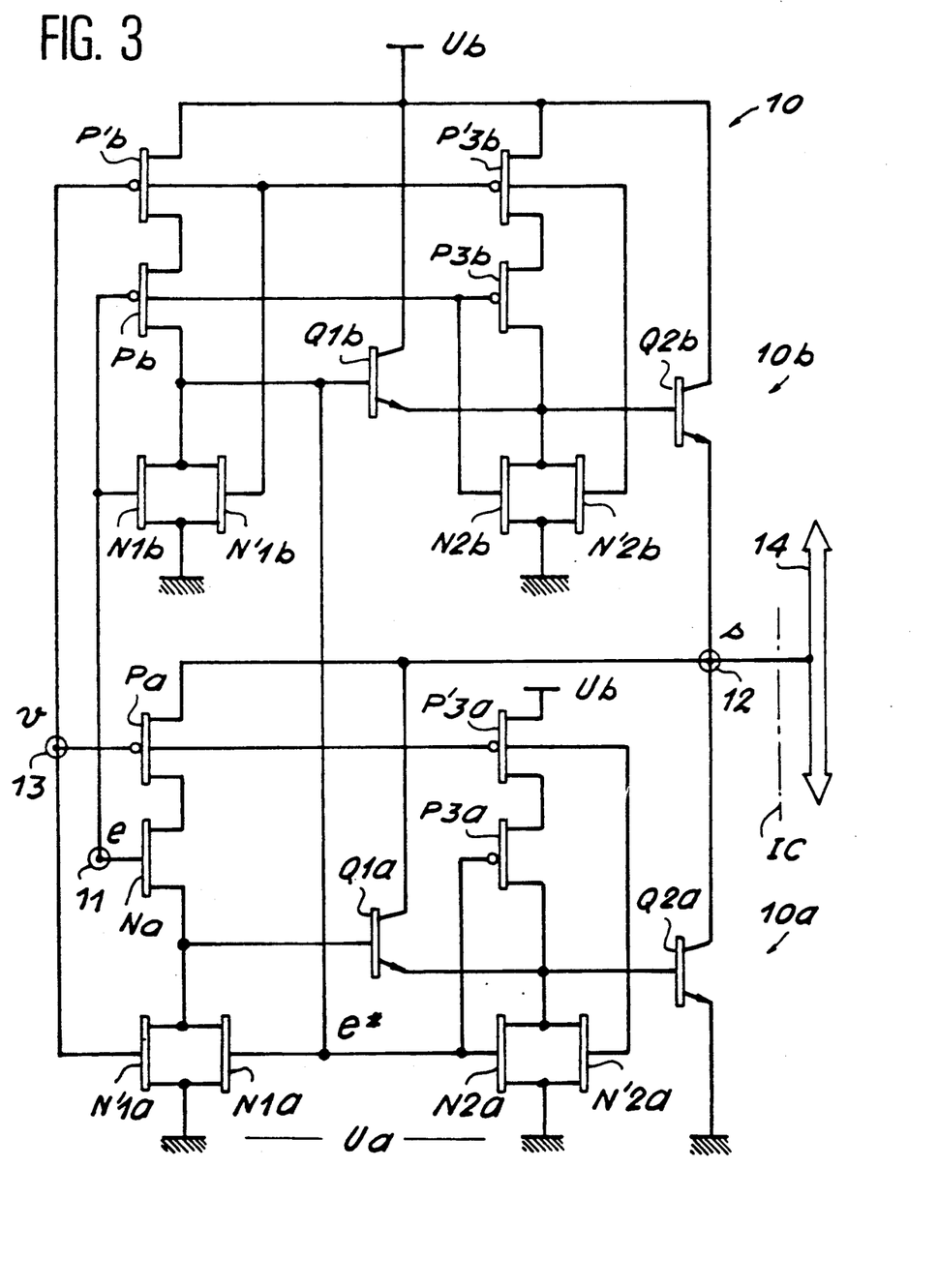
FIG. 3 is a schematic of an electrical circuit of a second type of amplifier according to the invention, presenting three logic states and constructed on the basis of the type of amplifier represented in FIG. 1.

Amplifier 10 represented in FIG. 3 is a second type of amplifier according to the invention, designed to deliver its output signal to a bus and, thus, called a bus transmitter. Amplifier 10 of the second type exhibits three logic states and has a structure based on the first type of amplifier such as that represented in FIG. 1. In FIG. 1 and 3, the same elements bear the same reference numbers. In FIG. 3, amplifier 10 bears a second input terminal 13 for a validation signal v, which is added to the input signal e applied on the input terminal 11. The second type of amplifier 10 is above all a buffer amplifier, of which the output terminal 12 corresponds in the example illustrated to the output terminal of an integrated circuit IC delimited partially and schematically by a phantom connection in FIG. 3. Most generally, the output terminal 12 can be connected to a separate output terminal of the integrated circuit. The output terminal 12 is meant for a connection with a bus 14 exterior to integrated circuit IC, as illustrated. The two sections 10a, 10b of amplifier 10 are also formed by the two CMOS transistors Na and Pb receiving on their gates the input signal e. They are connected in the same way to transistors N1a and N1b, as well as to bipolar transistors Q1a, Q2a; Q1b, Q2b. Transistors N1a, N2a, N1b, N2b are connected in the same way as in FIG. 1 and are placed respectively in parallel with the additional transistors N'1a, N'2a, N'1b, N'2b receiving the validation signal v on their gates. Transistor Na has its drain connected to the output terminal 12 via a transistor Pa receiving the validation signal v on its gate. Transistor Pb has its drain connected to potential Ub via transistor P'b receiving validation signal v on its gate. According to the invention, the bases of bipolar output transistors Q2a, Q2b are respectively connected to potential Ub via transistors P3a, P3b, of which the gates are connected in the same way as in FIG. 1 and of which the drain source path are in series with those of two additional transistors, P'3a, P'3b respectively, receiving the validation signal v on their gates.

When the validation signal v has the logic state "1", transistors Pa and P'b are non conductive. Amplifier 10 is thus placed in the non-functioning status and presents a high impedance to every exterior signal appearing on output terminal 12. In this state, amplifier 10 does not disturb the transmission of any signal on the bus 14 emanating from another amplifier 10 connected to the bus. When the validation signal v has the logic state "0", it permits the normal functioning of all the transistors of amplifier 10 which are common with those in FIG. 1, in such a way as to give an output signal s complementary to input signal e. In particular, it will be noted that transistors P'3a, P'3b are then in proper state to permit the normal functioning of transistors P3a and P3b according to the invention.

Figure 4:
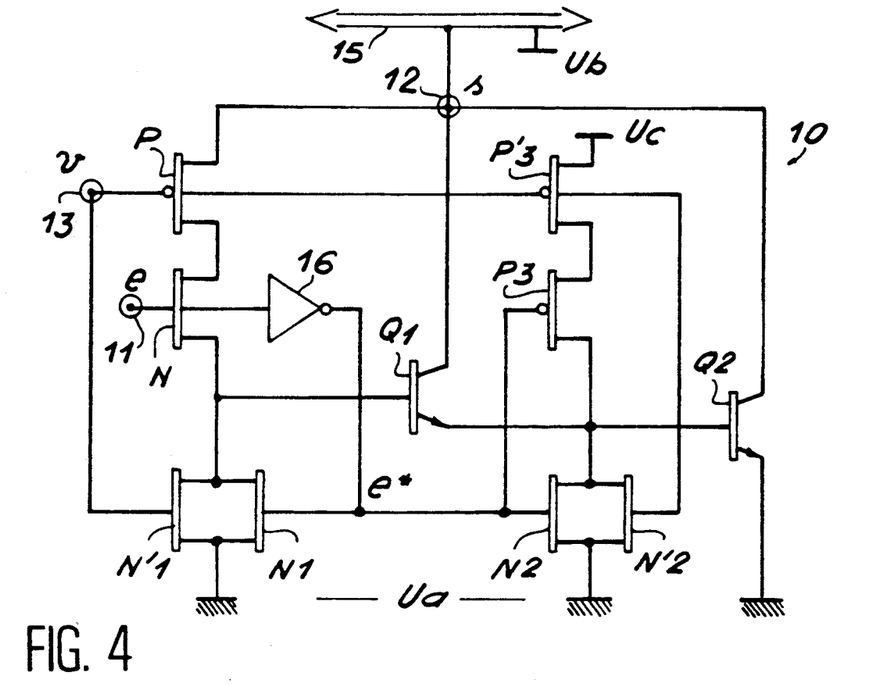
FIG. 4 and 5 are schematics of electric circuits of alternate embodiment of the invention of the amplifier represented in FIG. 3.
Figure 5:
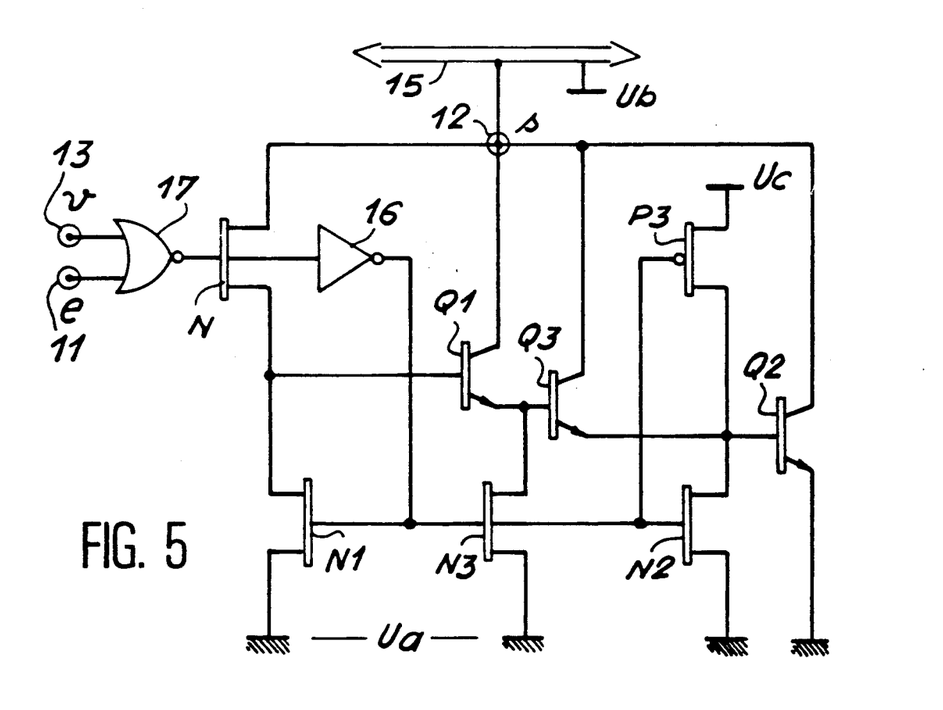

FIGS. 4 and 5 illustrate amplifiers 10 of a third type to which the invention can also be applied. These amplifiers are adapted to a connection on a precharged bus 15 and commonly called precharged bus transmitters. The presence of bus 15 implies that they have three states, like amplifier 10 represented in FIG. 3. Like the latter, amplifiers 10 of FIGS. 4 and 5 receive an input signal e and a validation signal v and their output terminal 12 is connected to bus 15. In contrast to bus 14 of FIG. 3, bus 15 in FIGS. 4 and 5 is precharged, ordinarily at the high level corresponding to potential Ub. In this way, amplifiers 10 of FIGS. 4 and 5 do not receive, in the standard manner, other than potential Ua (ground).

The circuit of amplifier 10 represented in FIG. 4 corresponds to section 10a of amplifier 10 represented in FIG. 3. In these two figures, the same elements bear the same reference numbers, with the exception of the letter a. The output terminal 12 is connected to ground via transistors P, N and N1 mounted in series. Input signal e at the input terminal 11 is applied to the gate of transistor N as well as to the input of an inverter 16, which furnishes the complementary input signal e* to transistor N1. The validation signal v on the validation terminal 13 is applied to the gate of transistor P. The junction of the source of transistor N with the drain of transistor N1 is connected to bipolar transistor Q1, of which the collector to the output terminal 12 and of which the emitter is connected to the base of bipolar output transistor Q2. Transistor Q2 has its emitter at ground and its collector connected to the output terminal 12. Its base is connected to ground via transistor N2 and to a fixed potential Uc (+3 volts, for example) via two transistors P3 and P'3 connected in series. Transistors N1 and N2 are connected in parallel with respective transistors N'1 and N'2. The gates of transistors N1, N2 and P3 receive the complementary input signal e*. The gates of the transistors P, N'1, N'2 and P'3 receive the validation signal v.

When the validation signal v is at logic state "1", transistors P and P'3 are off so that transistors N'1 and N'2 are conductive, thus discharging the capacitances of the bases of transistors Q1 and Q2. Amplifier 10 thus exhibits, at its output terminal 12, a high impedance for the transmission of every signal on bus 15 transmitted by another amplifier connected to the bus. If the amplifier 10 represented on FIG. 4 must transmit, the validation signal v takes logic status "0". Under these conditions, transistors P and P'3 are conductive and transistors N'1 and N'2 are off, so that transistors N, Q1, Q2, N1, N2 and P3 can function normally because the bus takes the logical state of input signal e. If the input signal e is at the logical state "0", transistors N, P3, Q1, Q2 are conductive and transistors N1 and N2 are off. Transistors N and P thus permit the injection of a current in the base of transistor Q1. Transistors Q1 and Q2 amplify this current and permit the rapid discharge of the capacitance of bus 15. Without transistors P3 and P'3 added according to the invention, the low levels of bus 15 corresponding to input signal e at logical state "1" will have the value of the 2 Vbe of transistors Q1 and Q2, which would be a value less than or equal to 1.6 volts. Due to transistors P3 and P'3, the low level of bus 15 may attain the value of potential Ua, ground in this case. As in preceding amplifiers, transistors P3 and P'3 conduct to inject a current in the base of bipolar transistor Q2 during the discharge of bus 15. The current injected is on the order of several tens of microamperes, such that the resulting dissipation is very weak. Thanks to the invention, the signal transmitted on the bus offers great immunity to noise and can adapt itself to TTL technology. In addition, it presents these same advantages whatever the number of bipolar transistors of the group connected to transistor N receiving the input signal e.

FIG. 5 presents an amplifier according to the invention, constituting an alternate embodiment of amplifier 10 represented in FIG. 4. In FIGS. 4 and 5, the same components are designated by the same reference numbers. This embodiment provides amplifier 10 in FIG. 5 a structure partially identical to that of section 10a of amplifier 10 represented in FIG. 1. The output terminal 12 connected to the precharged bus 15 is connected to the supply potential Ua (ground) by transistors N and N1 and, on the other hand, by a group formed of two bipolar transistors Q1 and Q2 and of an additional bipolar transistor Q3, all connected in series according to a Darlington configuration. The junction of the source of transistor N with the drain of transistor N1 is connected to the base of transistor Q1. The emitter of transistor Q1 is connected to the base of additional transistor Q3. The output transistor Q2 has its emitter at ground, its base connected to the emitter of transistor Q3 and its collector connected to the collectors of transistors Q1 and Q3 as well as to the output terminal 12. The base of output transistor Q2 is connected to ground by a transistor N2 and to a fixed potential Vc (+3 volts, for example) by a transistor P3. The base of transistor Q3 is also discharged towards ground by the action of a field effect transistor N3. The input signal e on the input terminal 11 and the validation signal v on the validation terminal 13 are applied to a NOR gate 17, of which the output is applied directly to the gate of transistor N and, via the inverter 16, to the gates of transistors N1, N2, N3 and P3. Inverter 16 and NOR gate 17 are advantageously produced in CMOS technology.

If the validation signal v has logic state "1", the amplifier 10 of FIG. 5 is not selected to transmit on bus 15. Transistor N is off and transistor N1 conducts in such a way that the base of transistor Q1 is coupled to ground. Transistors Q1, Q2 and Q3 are thus off and their bases discharged by transistors N1, N2 and N3, respectively. The equivalent capacitance of the bus 15 remains precharged at the high level corresponding to potential Ub. If amplifier 10 must transmit on bus 15, the validation signal v takes the logic state "0". If the input signal is logic state "1", the amplifier remains in the preceding state. In contrast, if the input signal e is at the logic state "0", transistors N and P3 conduct and transistors N1 and N2 are off. Transistors Q1, Q3 and Q2 conduct to discharge the capacitance at the bus 15. Due to transistor P3, the bus is discharged to attain the value of potential Ua, which would be 0 volts.

Even though potentials Ub and Uc are different in the examples described, it is evident that the operation will be identical for two equal values of Ub and Uc. In the same way, the embodiment in FIG. 5 which illustrates a group of three bipolar transistors in series can be applied to the other amplifiers 10 illustrated. In addition, as the embodiment in FIG. 5 is supplied from section 10a of amplifier 10 represented in FIG. 1, it may also have the structure of section 10a of the amplifier 10 represented in FIG. 2. In other words, transistors N1, N2 and N3 in FIG. 5 can be replaced by resistors R1, R2 and R3. It is also evident that a combination of resistors and transistors as basic discharge elements could be made in the same group of transistors in series. Finally, it is clear that in FIGS. 4 and 5, bus 15 may be precharged at the level Ub=0 volts, with Ua at +5 volts, for example.

In a general way, the preceding description shows the application of the invention for every binary amplifier incorporating at least one field effect transistor responsive to an input signal and connected to at least two bipolar transistors in series. The invention thus teaches connecting the base of the bipolar output transistor to a fixed potential via a field effect transistor of which the type and the control means assures its conduction when the bipolar transistors are conductive. It is clear that the presence of a discharge element at the base of each bipolar transistor is not necessary to obtain the advantages of the invention. The discharge elements serve for nothing other than to increase the transit time of the input signal e in amplifier 10 towards the output terminal 12. In this sense, they are in practice always advantageously connected to bipolar transistors. The preceding description has also given evidence of the fact that the control of a transistor by the input signal e or the validation signal v includes their complements e* and v*.

What is claimed is:

1. An integrated binary amplifier having first and second logic states comprising: two field effect transistors responsive to an input signal, so as to conduct on a mutually exclusive basis, and connected respectively to separate Darlington circuits, providing an output signal and each including an output transistor having a base which is coupled to a fixed potential via a current path including a field effect transistor responsive to the input signal or its complement to be conductive when the output bipolar transistor is conductive.

2. An amplifier according to claim 1, of the type having a third logic state commanded by a validation signal wherein the current path includes the drain source path of an additional field effect transistor commanded by the validation signal.

3. An amplifier according to claim 2, wherein the fixed potential is a supply potential.

4. An amplifier according to claims 1 to 3, including a discharge element at the base of each bipolar transistor in series.

5. An amplifier according to claim 4, wherein the discharge element is a field effect transistor commanded by the input signal and of which the drain source path connects the base of one of said bipolar transistors in series to a supply potential.

6. An amplifier according to claim 4, wherein the discharge element is a resistor.

7. An amplifier according to claim 1, wherein said amplifier is embodied in an integrated circuit.

8. An amplifier according to claim 7, wherein in the amplifier there is a buffer amplifier of which the output terminal corresponds or is connected to the output terminal of the integrated circuit.

9. An integrated binary amplifier having first, second and third logic states, comprising a first field effect transistor receiving an input signal and connected to a first Darlington circuit for providing an output signal and including an output bipolar transistor having a base which is coupled to a fixed potential via a current path including the drain source path of a first field effect transistor responsive to the input signal or its complement to be conductive when the output bipolar transistor is conductive, said third logic state commanded by a validation signal wherein the current path includes the drain source path of a second field effect transistor commanded by the validation signal.

10. An amplifier according to claim 9 wherein the fixed potential is a supply potential.

11. An amplifier according to claim 9, further including a second field effect transistor connected to a second separate Darlington circuit and responsive to the input signal such that the first and second field effect transistors conduct on a mutually exclusive basis.

12. An amplifier according to claims 9 to 11, including a discharge element at the base of each bipolar transistor in each said Darlington circuit.

13. An amplifier according to claim 12 wherein said discharge element is a field effect transistor commanded by the input signal or its complement and of which the drain source path connects the base of one of said bipolar transistors in each said Darlington circuit to a supply potential.

14. An amplifier according to claim 12, wherein the discharge element is a resistor.

15. An amplifier according to claim 9, wherein said amplifier is embodied in an integrated circuit.

16. An amplifier according to claim 15, wherein the output terminal of said amplifier is the output terminal of the integrated circuit.

17. An integrated binary amplifier comprising:
first and second field-effect transistors each having a gate and an output, each said transistor responsive to an input signal received at its respective gate such that first and second field effect transistors conduct on a mutually exclusive basis;
third and fourth field-effect transistors, having a gate and an output, and each forming a current path from a fixed potential to its respective output;
first and second Darlington circuits each including an output transistor, and each said output transistor having a base, a collector and an emitter, wherein,
said first and second Darlington circuits respectively connected to said outputs of said first and second field-effect transistors;
said bases of said output transistors of said first and second Darlington circuits respectively connected to said outputs of said third and fourth field-effect transistors;
said emitter of said output transistor of said first Darlington circuit and said collector of said output transistor of said second Darlington circuit forming a connection to provide the output of said amplifier at said connection; and
said gates of said third and fourth field-effect transistors receiving said input signal or its complement such that each transistor conducts when said output transistors in said first and second Darlington circuits respectively conduct.

18. An integrated binary amplifier comprising: a field effect transistor responsive to an input signal, having a drain source path coupled between a low supply potential and means to be precharged at a high potential and an output connected to a Darlington circuit for providing an output signal and including an output bipolar transistor having a base which is coupled to a fixed potential via a current path including a field effect transistor responsive to the input signal or its complement to be conductive when the output bipolar transistor is conductive.

19. An amplifier according to claim 18, wherein the fixed potential is a supply potential.

20. An amplifier according to claim 18 wherein said Darlington circuit comprises at least two bipolar transistors.

21. An amplifier according to claims 18 to 20, including a discharge element at a base of each said bipolar transistor.

22. An amplifier according to claim 21, wherein the discharge element is a field effect transistor commanded by the input signal and of which the drain source path connects the base of one of said bipolar transistors to a supply potential.

23. An amplifier according to claim 22, wherein the discharge element is a resistor.

24. An amplifier according to claim 18, wherein said amplifier is embodied in an integrated circuit.

25. An amplifier according to claim 24, wherein the output terminal of said amplifier is the output terminal of the integrated circuit.

26. An integrated binary amplifier, having first and second logic states comprising: two field effect transistors responsive to an input signal, so as to conduct on a mutually exclusive basis, and connected respectively to high and low supply potentials, and a Darlington circuit for providing an output signal and comprising an input bipolar transistor coupled to the field effect transistor connected to the high supply potential, at least one intermediate bipolar transistor and an output bipolar transistor having a base, the base of the bipolar output transistor being coupled to a fixed potential via a current path including a field effect transistor responsive to the input signal or its complement to be conductive when the bipolar transistors are conductive.

27. An amplifier according to claim 26, of the type having a third logic state commanded by a validation signal wherein the current path includes the drain source path of an additional field effect transistor commanded by the validation signal.

28. An amplifier according to claim 27, wherein the fixed potential is a supply potential.

29. An amplifier according to claims 26 to 28, including a discharge element at the base of each said bipolar transistor.

30. An amplifier according to claim 29, wherein the discharge element is a field effect transistor commanded by the input signal and of which the drain source path connects the base of one of said bipolar transistors to a supply potential.

31. An amplifier according to claim 30, wherein the discharge element is a resistor.

32. An amplifier according to claim 26, wherein said amplifier is embodied in an integrate circuit.

33. An amplifier according to claim 32, wherein the output terminal of said amplifier is the output terminal of the integrated circuit.

* * * * *